United States Patent
Daminger et al.

(10) Patent No.: US 12,284,787 B2
(45) Date of Patent: Apr. 22, 2025

(54) ELECTRIC APPLIANCE HAVING A HOUSING PART

(71) Applicant: SEW-EURODRIVE GMBH & CO. KG, Bruchsal (DE)

(72) Inventors: Franz Daminger, Ludwigshafen am Rhein (DE); Ralph Mayer, Ubstadt-Weiher (DE)

(73) Assignee: SEW-EURODRIVE GMBH & CO. KG, Bruchsal (DE)

(*) Notice: Subject to any disclaimer, the term of this patent is extended or adjusted under 35 U.S.C. 154(b) by 284 days.

(21) Appl. No.: 17/603,141

(22) PCT Filed: Mar. 10, 2020

(86) PCT No.: PCT/EP2020/025120
§ 371 (c)(1),
(2) Date: Oct. 12, 2021

(87) PCT Pub. No.: WO2020/207621
PCT Pub. Date: Oct. 15, 2020

(65) Prior Publication Data
US 2022/0201899 A1   Jun. 23, 2022

(30) Foreign Application Priority Data

Apr. 10, 2019   (DE) .......................... 102019002627.6

(51) Int. Cl.
*H05K 7/20* (2006.01)
*H05K 5/04* (2006.01)

(52) U.S. Cl.
CPC .......... *H05K 7/20409* (2013.01); *H05K 5/04* (2013.01); *H05K 7/209* (2013.01)

(58) Field of Classification Search
CPC .................. H05K 7/2089; H05K 3/32; H05K 2201/10545; H05K 7/20409; H05K 5/04;
(Continued)

(56) References Cited

U.S. PATENT DOCUMENTS 3,242,984 A * 3/1966 Pelce .................... F28F 1/16
D23/323
3,421,578 A * 1/1969 Marton ................ H01F 27/085
257/722
(Continued)

FOREIGN PATENT DOCUMENTS

DE   8520677 U1   8/1985
DE   19619060 A1   11/1997
(Continued)

OTHER PUBLICATIONS

International Search Report issued in corresponding International Application No. PCT/EP2020/025120, dated Oct. 20, 2020, pp. 1-6, English Translation.

*Primary Examiner* — Adam B Dravininkas
(74) *Attorney, Agent, or Firm* — Carter, DeLuca & Farrell LLP

(57) ABSTRACT

An electric appliance includes a housing part, and first, second, and third cooling fins are premolded or provided on the housing part. The housing part has a wall, e.g., a topside, and two side walls, and of the cooling fins extends along the wall and at least one of the side walls.

22 Claims, 4 Drawing Sheets

(58) Field of Classification Search
CPC .. H05K 7/1427; H05K 7/209; H05K 7/20436; H05K 7/2039
See application file for complete search history.

(56) References Cited

U.S. PATENT DOCUMENTS

| | | | | |
|---|---|---|---|---|
| 5,065,278 A | * | 11/1991 | Schultz | H05K 7/209 |
| | | | | 361/825 |
| 5,150,278 A | * | 9/1992 | Lynes | H05K 7/1015 |
| | | | | 165/80.3 |
| D336,074 S | * | 6/1993 | Friend | D13/184 |
| 5,455,739 A | | 10/1995 | Barden | |
| 5,514,917 A | * | 5/1996 | Rudy, Jr. | H01R 13/74 |
| | | | | 361/689 |
| D379,088 S | * | 5/1997 | Hopper | D13/152 |
| 5,930,113 A | * | 7/1999 | McCann | H05K 7/20409 |
| | | | | 361/688 |
| 6,028,769 A | | 2/2000 | Zurek | |
| 6,038,129 A | * | 3/2000 | Falaki | H05K 7/209 |
| | | | | 361/689 |
| 6,065,530 A | * | 5/2000 | Austin | H05K 9/0049 |
| | | | | 174/16.3 |
| 6,313,339 B1 | * | 11/2001 | Ross, Jr. | A01N 37/36 |
| | | | | 544/242 |
| 6,354,461 B1 | * | 3/2002 | Tenney | E05D 7/1044 |
| | | | | 220/4.23 |
| D458,228 S | * | 6/2002 | Jacobson | D13/152 |
| 6,418,020 B1 | * | 7/2002 | Lin | H01L 23/367 |
| | | | | 174/16.3 |
| D568,841 S | * | 5/2008 | Fischer | D13/184 |
| 7,633,757 B2 | | 12/2009 | Gustine et al. | |
| D796,431 S | * | 9/2017 | Lau | D13/107 |
| 10,080,311 B1 | | 9/2018 | Musiol | |
| 2004/0218362 A1 | | 11/2004 | Amaro et al. | |
| 2004/0256085 A1 | * | 12/2004 | Barsun | F28F 3/02 |
| | | | | 257/E23.099 |
| 2005/0063159 A1 | | 3/2005 | Ma | |
| 2008/0236791 A1 | * | 10/2008 | Wayman | H01L 23/467 |
| | | | | 165/170 |
| 2009/0103267 A1 | | 4/2009 | Wieland et al. | |
| 2010/0177478 A1 | | 7/2010 | Akalanne et al. | |
| 2011/0232885 A1 | | 9/2011 | Kaslusky et al. | |
| 2014/0174693 A1 | | 6/2014 | Wong et al. | |
| 2015/0211801 A1 | | 7/2015 | Philippart et al. | |
| 2016/0044821 A1 | | 2/2016 | Schwartz et al. | |

FOREIGN PATENT DOCUMENTS

| | | |
|---|---|---|
| DE | 202004015117 U1 | 12/2004 |
| DE | 112012000142 B4 | 10/2014 |
| DE | 102015205985 A1 | 10/2016 |
| DE | 102019005610 A1 | 2/2020 |
| DE | 102019005611 A1 | 2/2020 |
| EP | 2848103 A2 | 3/2015 |
| WO | 2020043323 A1 | 3/2020 |
| WO | 2020043324 A1 | 3/2020 |

* cited by examiner

ELECTRIC APPLIANCE HAVING A HOUSING PART

FIELD OF THE INVENTION

The present invention relates to an electric appliance having a housing part.

BACKGROUND INFORMATION

In certain conventional systems, cooling fins improve the heat flow that is to be convectively carried away from a housing part.

SUMMARY

Example embodiments of the present invention provide for improving the removal of heat in an electric appliance.

According to example embodiments of the present invention an electric appliance includes a housing part, and first, second, and third cooling fins are premolded or provided on the housing part. The housing part has a wall, e.g., a topside, and two side walls. Each of the cooling fins extends along the wall and at least one of the side walls.

This offers the advantage that no fluids can collect and the heat flow is therefore not reduced by collected fluid quantities. In particular, it is possible to conduct the heat flow from the direction of the wall to the cooling fins in order to spread out the heat. Because of the thin configuration of the cooling fins, a highly dynamic variation of the heat flow introduced into the wall is provided. This is because the cooling fins conduct the heat flow from the region of the wall to the region of the side walls and the region of the cooling fins, which have a thicker configuration. A large thermal capacity without resistance to the heat transfer is obtained in this manner. Thus, if a high heat flow is introduced into the wall, it is rapidly conducted via the cooling fins to the regions of the cooling ribs that are reinforced in the side walls.

Because a respective cooling fin surrounds two or three sides of the housing part, a convectively driven airflow is driven along the cooling fins in different spatial positions of the housing part. Efficient cooling in any spatial position is therefore obtained in this manner.

The electric appliance is, for example, arranged as a converter for feeding the electric motor. This briefly requires high power outputs such as during an acceleration of the electric motor, which, however, also leads to high thermal power losses of the power electronics of the converter. The housing part arranged as described herein allows the heat flow to rapidly spread out in the direction of a thermal capacity, i.e., for example, reinforced regions of the cooling fins and/or bars, disposed at a distance from the inflow point.

According to example embodiments, the first cooling fins extend along the wall and a first side wall, the third cooling fins extend along the other, e.g., a second, side wall and the wall, and the second cooling fins extend along the wall and the two side walls. This offers the advantage that each one of the cooling fins extends across at least two different walls, i.e., walls that also have different orientations. Each one of the walls has a roughly planar configuration or at least is aligned in a respective preferred spatial direction. As a result, each cooling fin extends across at least two different directions in space.

According to example embodiments, the characteristic of each of the first, second, and third cooling fins has at least one arc-shaped region. This offers the advantage that a convectively driven airflow is provided in at least two different spatial orientations of the housing part. This is because if the cooling fins were to extend in only a single plane, then no convectively driven airflow could result transversely to this plane.

According to example embodiments, the characteristic of the first cooling fins always has a non-positive radius of curvature, the characteristic of the third cooling fins always has a non-negative radius of curvature, and the characteristic of the second cooling fins has a positive radius of curvature in a first region and a negative radius of curvature in a second region. For example, the characteristic is represented by the respective perpendicular projection of the respective tip of the cooling fin onto the surface, e.g., onto the respective side, of the housing part, and the tip of the cooling fin along the extension of the cooling fin, e.g., is the surface point that is most remote from the housing part in each case. This has the advantage that convectively driven airflows are able to be generated in different spatial orientations of the housing part and fluids are carried away.

According to example embodiments, the characteristic of the first cooling fins in the extension direction has a positively curved arc, the characteristic of the third cooling fins in the extension direction has a negatively curved arc, and the characteristic of the second cooling fins in the extension direction has a positively curved arc in a first region and a negatively curved arc in a second region. The characteristic, for example, is the perpendicular projection of the cooling fin tips onto the surface, e.g., onto the respective side, of the housing part, and along the extension of the cooling fin, the tip of the cooling fin, for example, is the surface point most remote from the housing part. This has the advantage that convectively driven air flows are able to be generated in different spatial orientations of the housing part and fluids are carried away.

According to example embodiments, on each one of the side walls, a reinforced region of the wall thickness of the housing part, which is arranged as a bar, connects two cooling fins that are situated closest to each other, e.g., each one of the cooling fins being connected to at least one of the bars. This offers the advantage that heat from the heat-generating element is introduced into the wall and the introduced heat flow is spread out with the aid of the cooling fins until it reaches the large thermal capacity formed by the bars. As a result, the heat flow flows into this thermal capacity and is dissipated there into the environment in a uniform manner, e.g., to a convectively passing air flow, because the bars project from the respective side wall to a lesser extent than the cooling fins.

According to example embodiments, all bars provided on the first side wall have the same distance from the wall, and, for example, have a collinear arrangement with respect to one another. This has the advantage that an air flow is able to pass evenly across the bars.

According to example embodiments, all bars provided on the second side wall are arranged in a straight line one after the other, e.g., set apart only by respective cooling fins, e.g., each one of the bars having the same thickness and/or a similar shape. This offers the advantage that an uncomplicated production is possible and an efficient flow by a convectively driven air flow can be generated, e.g., in a laminar fashion.

According to example embodiments, the wall thickness of the housing part in the region of a respective bar is thinner than the wall thickness of the housing part in the particular region of the cooling fins that abut the respective bar. This offers the advantage that despite the bars, the air flow can be guided within the channel provided between the cooling fins that are situated closest to one another.

According to example embodiments, the side walls are aligned substantially perpendicular to the wall, e.g., the topside. This has the advantage that a convectively driven air flow is able to be generated in different spatial orientations.

According to example embodiments, the wall thickness, e.g., on the side walls, of the first, second, and third cooling fins increases monotonically, e.g., strictly monotonically, with increasing distance from the wall. This offers the advantage that a greater thermal capacity is able to be provided close to the side wall. These reinforced regions together with the bars thus bring about an increase in the thermal capacity.

According to example embodiments, the wall thickness of the region of the first, second, and third cooling fins extending on the wall has a decreasing wall thickness with increasing distance from the wall, the wall thickness of the region of the first, second, and third cooling fins extending on the first side wall has a decreasing wall thickness with increasing distance from the first side wall, and the wall thickness of the region of the first, second, and third cooling fins extending on the second side wall has a decreasing wall thickness with increasing distance from the second side wall. This has the advantage that the thermal capacity close to the side wall is arranged to be greater.

According to example embodiments, the housing part is produced as a cast metal part. This has the advantage of allowing for a cost-effective and simple production.

According to example embodiments, a heat-generating component, e.g., a module having a controllable power semiconductor, is connected in a thermally conductive manner to the housing part on the inner side of the wall. This offers the advantage that the component is easily coolable. For example, even in a highly dynamic operation, a rapid absorption of the heat through spreading and a uniform dissipation of the heat into the environment from the greater thermal capacity of the bars and the reinforced cooling fin regions is achievable.

According to example embodiments, the first side wall is aligned in parallel with the second side wall, the wall being aligned perpendicular to the first and second side wall. This has the advantage that efficient cooling is implementable in at least three different spatial orientations.

Further features and aspects of example embodiments of the present invention are described in greater detail below with reference to the appended schematic Figures.

DETAILED DESCRIPTION

Figure 1:
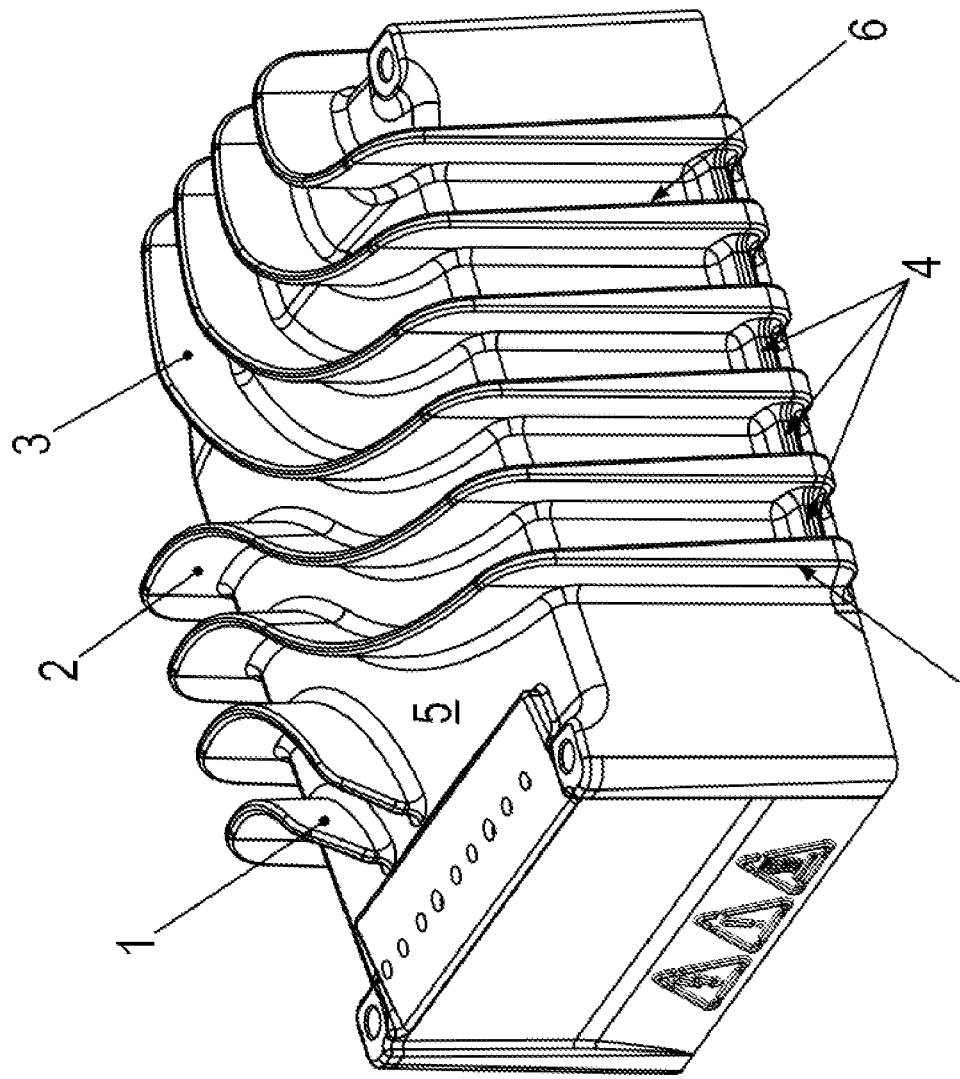
FIG. 1 schematically illustrates a housing part 5 of an electric appliance, the housing part having cooling fins (1, 2, 3).
Figure 2:
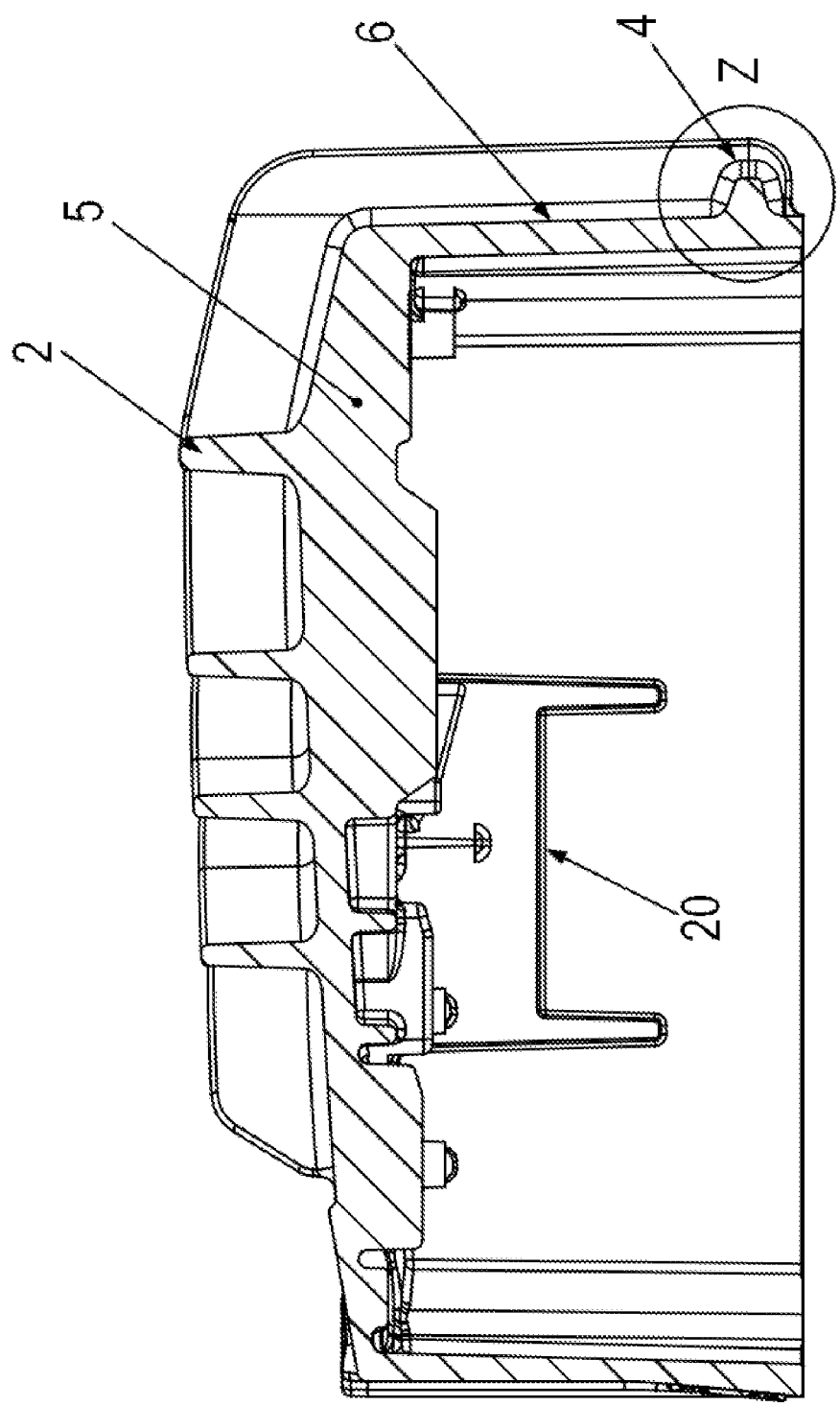
FIG. 2 is a schematic cross-sectional view through housing part 5.
Figure 3:
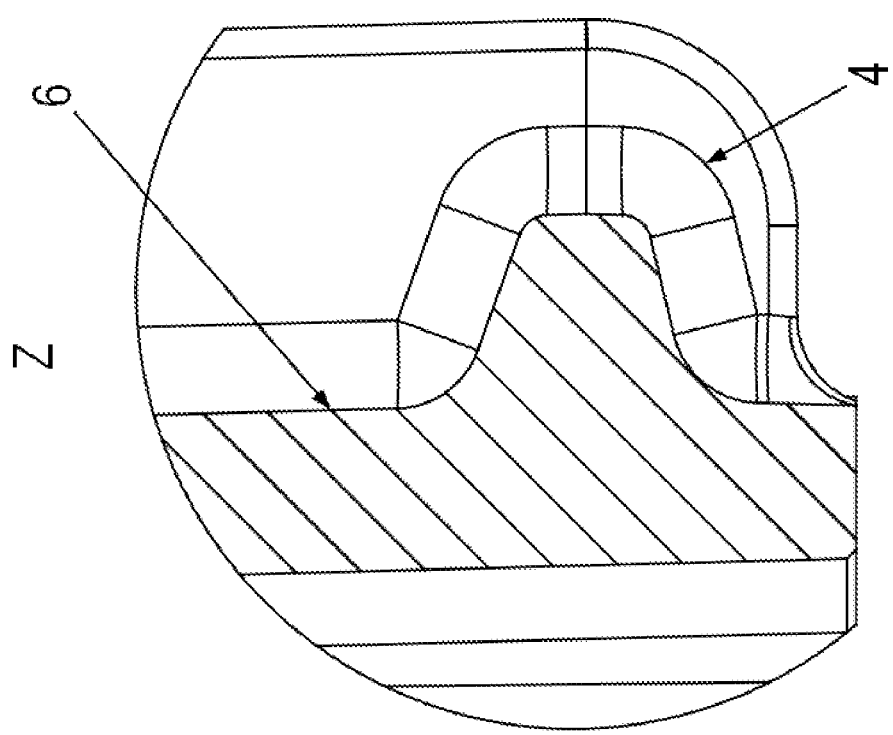
FIG. 3 is an enlarged view of a portion of FIG. 2.

As schematically illustrated in the Figures, housing part 5 has cooling fins (1, 2, 3).

First cooling fins 1 extend across a side wall and the topside of housing part 5.

Second cooling fins 2 extend across the side wall, the topside and a further side wall of housing part 5.

Third cooling fins 3 extend across the further side wall and the topside of housing part 5.

First cooling fins 1 do not extend in a straight line but have a curved configuration. Along their extension at the surface of housing part 5, the characteristic of first cooling fins 1 has an arc, which ideally corresponds to a quadrant arc, for example. The arc is situated on the topside of housing part 5.

Along the extension of second cooling fins 2, the characteristic of second cooling fins 2 has a double arc at the surface, e.g., the topside, of housing part 5, the first arc extending in an inversely curved form in relation to the second arc of the double arc.

Third cooling fins 3 also do not extend in a straight line but have a curved configuration. Along their extension at the surface of housing part 5, the characteristic of third cooling fins 3 likewise has an arc, which ideally corresponds to a quadrant arc. The arc is also situated at the topside of housing part 5 but is inversely curved in comparison with the arc of the characteristic of first cooling fins 1.

As schematically illustrated in FIG. 1, two first cooling fins 1, two second cooling fins 2, and four third cooling fins 3 are provided on housing part 5.

On the two side walls, the first, second and third cooling fins (1, 2, 3) have a, e.g., monotonically or even strictly monotonically increasing wall thickness with increasing distance from the topside.

A heat-generating element, e.g., a controllable semiconductor switch or a module having controllable semiconductor switches, is situated in the interior space that is surrounded by housing part 5. For the introduction of the heat flow of the heat-generating element, housing part 5 has on its inner side, e.g., in the center of the topside, a finely machined surface, or in other words, connection surface 20, against which the heat-generating element is resting, e.g., under pressure exerted by screws or a spring element. The heat flow thus centrally enters the topside and is then spread out from the topside and also conducted into the cooling fins (1, 2, 3).

Since the cooling fins (1, 2, 3) have a thin configuration at the topside, the temperature of the cooling fins (1, 2, 3) follows the temperature characteristic of the heat-generating element with a short time delay and without any substantial difference or with a constant difference.

Thus, dynamic spreading of the heat flow is able to take place. When the output of the electric appliance fluctuates, e.g., of the converter, and thus the heat flow as well, the topside therefore rapidly absorbs the heat flow. The cooling fins have a thicker configuration on the side walls with increasing distance from the topside. As a result, a greater thermal capacity is provided there and thus a more uniform heat dissipation into the environment is possible. The greater thermal capacity in these regions prevents highly dynamic fluctuations. However, the absorption capacity for thermal energy is much higher.

Moreover, additional reinforced regions, which are arranged as bars 4 between the cooling fins (1, 2, 3), are provided on the two side walls. Here, a bar 4 connects two cooling fins (1, 2, 3) situated closest to each other. The wall thickness of housing part 5 in the region of bars 4 is less than in the regions of the cooling fins (1, 2, 3) abutting the bars.

The cooling fins (1, 2, 3) are, for example, situated equidistantly from one another on the side walls and have a minimum distance from the respective closest neighboring cooling fins (1, 2, 3). At the topside, a minimum distance of the cooling fins (1, 2, 3) among one another is maintained. As a result, the cooling fins at the topside extend in parallel with the minimum distance from their closest neighboring cooling fins (1, 2, 3) or the distance increases or decreases monotonically but is always greater than the minimum distance.

Bars 4 have a collinear arrangement, that is to say, are arranged in a straight line. Bars 4 thus all have the same distance from the topside.

The wall thickness of the cooling fins (1, 2, 3) is constant at the topside of housing part 5.

Figure 4:
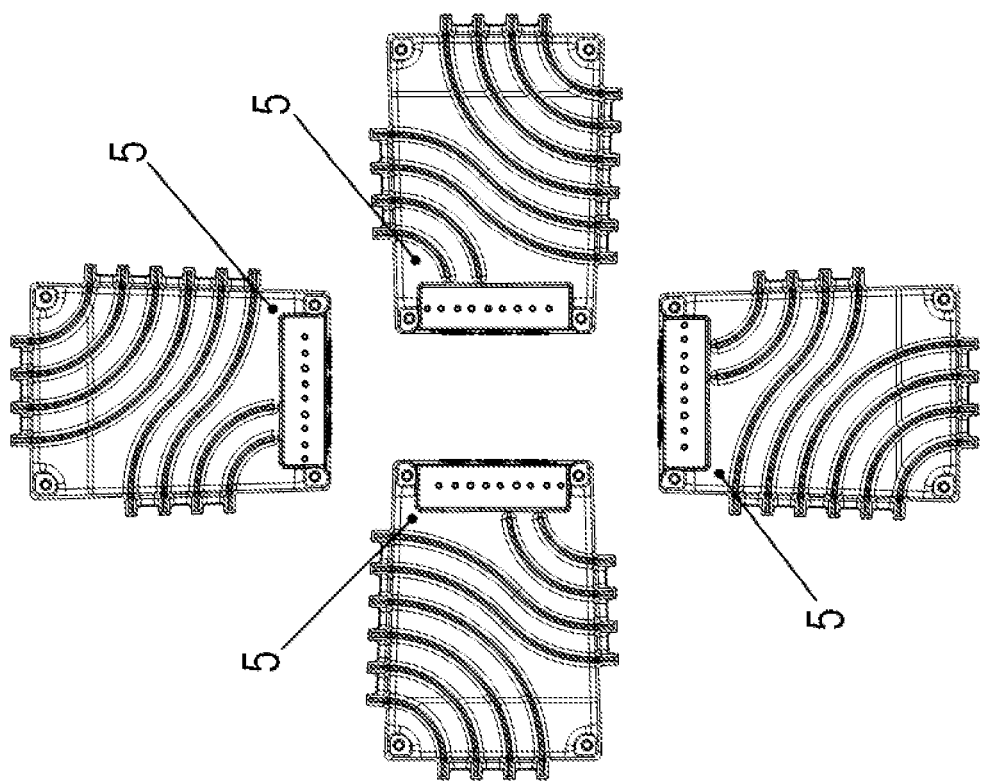
FIG. 4 schematically illustrates different spatial orientations of housing part 5.

As schematically illustrated in FIG. 4, water is carried off in multiple different spatial orientations of the housing part. In view of these orientations, water is thus also unable to collect in any region.

In further exemplary embodiments, the cooling fins (1, 2, 3) have a wall thickness everywhere that decreases monotonically or even strictly monotonically with an increasing distance from the respective most proximate side of housing part 5. Nevertheless, the first, second, and third cooling fins (1, 2, 3) on the two side walls have a, e.g., monotonically or even strictly monotonically increasing wall thickness with increasing distance from the topside.

LIST OF REFERENCE NUMERALS 1 cooling fin
2 cooling fin
3 cooling fin
4 bar
5 housing part
6 reinforced region
20 connection surface

The invention claimed is:

1. An electric appliance, comprising:
a housing part including a wall and two side walls; and
first cooling fins, second cooling fins, and third cooling fins premolded and/or provided on the housing part, each cooling fin extending along the wall and at least one of the side walls;
wherein each side wall includes a reinforced region of a wall thickness of the housing part arranged as a transverse bar connecting two cooling fins that are arranged closest to each other in a transverse direction relative to an extension direction of the cooling fins; and
wherein the wall thickness of the housing part in a region of a respective transverse bar is thinner than the wall thickness of the housing part in a region of the cooling fins that abuts the respective transverse bar and a height of each transverse bar measured from the side wall is less than a height of the cooling fins in the region of the cooling fins that abuts the respective transverse bar; and
wherein, along a length of the cooling fins along a length of the wall and along a length of the side walls, the wall thickness of the housing part between each pair of adjacent cooling fins is thinner than the wall thickness of the housing part along the cooling fins.

2. The electric appliance according to claim 1, wherein the wall is arranged as a top side of the housing.

3. The electric appliance according to claim 1, wherein the first cooling fins extend along the wall and a first one of the two side walls, the third cooling fins extend along the wall and a second one of the two side walls, and the second cooling fins extend along the wall and the two side walls.

4. The electric appliance according to claim 1, wherein each cooling fin includes at least one arc-shaped region.

5. The electric appliance according to claim 1, wherein a course of the first cooling fins extends only in a non-positive radius of curvature, a course of the third cooling fins extends only in a non-negative radius of curvature, and the second cooling fins have a positive radius of curvature in a first region and a negative radius of curvature in a second region.

6. The electric appliance according to claim 5, wherein the course is represented by a respective perpendicular projection of a respective tip of the cooling fin onto a surface and/or a respective side of the housing part.

7. The electric appliance according to claim 6, wherein the tip of the cooling fin along an extension of the cooling fin is a surface point that is most remote from the housing part.

8. The electric appliance according to claim 1, wherein a course of the first cooling fins in an extension direction has a positively curved arc, a course of the third cooling fins in an extension direction has a negatively curved arc, and a course of the second cooling fins in an extension direction has a positively curved arc in a first region and a negatively curved arc in a second region.

9. The electric appliance according to claim 8, wherein the course is a perpendicular projection of cooling fin tips onto a surface and/or a respective side of the housing part.

10. The electric appliance according to claim 9, wherein the tip of the cooling fin along the extension of the cooling fin is a surface point most remote from the housing part.

11. The electric appliance according to claim 1, wherein each cooling fin is connected to at least one of the transverse bars.

12. The electric appliance according to claim 1, wherein all transverse bars arranged on a first one of the two side walls have a same distance from the wall and/or are collinear with respect to each other.

13. The electric appliance according to claim 1, wherein all transverse bars arranged on a second one of the two side walls are arranged in a straight line one behind another, are set apart only by respective cooling fins, and/or has a same thickness and/or a similar shape.

14. The electric appliance according to claim 1, wherein the side walls are aligned substantially perpendicular to the wall.

15. The electric appliance according to claim 1, wherein a wall thickness of the cooling fins increases monotonically and/or strictly monotonically with increasing distance from the wall.

16. The electric appliance according to claim 1, wherein a wall thickness of a region of the cooling fins extending on the wall has a decreasing wall thickness with increasing distance from the wall, a wall thickness of a region of the cooling fins extending on a first one of the two side walls has a decreasing wall thickness with increasing distance from the first one of the two side walls, and a wall thickness of a region of the cooling fins extending on a second one of the two side walls has a decreasing wall thickness with increasing distance from the second one of the two side walls.

17. The electric appliance according to claim 1, wherein the housing part is arranged as a cast metal part.

18. The electric appliance according to claim 1, wherein a heat-generating component and/or a module having a controllable power semiconductor is connected in a thermally conductive manner to the housing part at an inner side of the wall.

19. The electric appliance according to claim 1, wherein a first one of the two side walls is parallel to a second one of the two side walls, and the wall is perpendicular to the two side walls.

20. The electric appliance according to claim 1, wherein a wall thickness of each cooling fin provided on the housing part increases monotonically and/or strictly monotonically with increasing distance from the wall along an entire length of the cooling fin.

21. An electric appliance, comprising:
a housing part including a wall and two side walls; and
first cooling fins, second cooling fins, and third cooling fins premolded and/or provided on the housing part, each cooling fin extending along the wall and at least one of the side walls;
wherein each side wall includes a reinforced region of a wall thickness of the housing part arranged as a transverse bar connecting two cooling fins that are arranged closest to each other in a transverse direction relative to an extension direction of the cooling fins;
wherein the wall thickness of the housing part in a region of a respective transverse bar is thinner than the wall thickness of the housing part in a region of the cooling fins that abuts the respective transverse bar and a height of each transverse bar measured from the side wall is less than a height of the cooling fins in the region of the cooling fins that abuts the respective transverse bar; and
wherein a wall thickness of the cooling fins increases monotonically and/or strictly monotonically with increasing distance from the wall along an entire length of the cooling fin.

22. The electric appliance according to claim 21, wherein a wall thickness of each cooling fin provided on the housing part increases monotonically and/or strictly monotonically with increasing distance from the wall along an entire length of the cooling fin.

\* \* \* \* \*